United States Patent [19]
Lyden

[11] Patent Number: 6,107,947
[45] Date of Patent: Aug. 22, 2000

[54] PARALLEL SIGMA DELTA MODULATOR

[75] Inventor: Colin Lyden, Co. Cork, Ireland

[73] Assignee: University College Cork, Ireland

[21] Appl. No.: 08/962,871

[22] Filed: Nov. 3, 1997

[30] Foreign Application Priority Data

Nov. 5, 1996 [IE] Ireland ..................................... 960773

[51] Int. Cl.[7] .................................................. H03M 3/00
[52] U.S. Cl. ............................................. 341/143; 341/200
[58] Field of Search ..................................... 341/143, 200

[56] References Cited

U.S. PATENT DOCUMENTS

| | | | |
|---|---|---|---|
| 5,406,283 | 4/1995 | Leung ...................................... | 341/143 |
| 5,598,159 | 1/1997 | Hein ........................................ | 341/143 |
| 5,682,161 | 10/1997 | Ribner et al. ............................ | 341/143 |
| 5,757,300 | 5/1998 | Koilpillai et al. ....................... | 341/143 |

*Primary Examiner*—Howard L. Williams
*Attorney, Agent, or Firm*—Rossi & Associates

[57] ABSTRACT

In a Sigma Delta converter, a succession of input signal samples are processed in an iterative manner to provide a succession of output signals and feedback signals, which are matched to the input signal samples over a specified frequency range. Two or more successive iterations are carried out in parallel so as to provide a sequence of independent outputs available in parallel. This provision of parallel outputs facilitates an overall increase in the speed of operation of the converter, which is otherwise limited by the maximum available rate of clocking of the converter's filters.

20 Claims, 8 Drawing Sheets

PARALLEL SIGMA DELTA MODULATOR

BACKGROUND OF THE INVENTION

1. Field of the Invention

This invention relates to data conversion. The invention is especially directed to analog to digital (ADC) and digital to analog convertors (DAC). The invention is particularly directed to sigma delta (ΣΔ) modulators in data conversion and data converters of the foregoing kind.

Sigma delta (ΣΔ) modulators are well established for use in high resolution analog to digital and digital to analog data conversion. Their speed of operation, which is moderate by the standards of present-day data converters, is limited by the maximum achievable rate of clocking of the modulator's filters. Typically the filters in the sigma delta modulator must be clocked at 50 to 200 times the bandwidth of the signal to be converted.

2. Description of the Prior Art

A sigma delta modulator is comprised of an input sampler, a filter, a quantiser, and a feedback path to take the quantiser's output back to a summer at the input end of the filter. The quantiser output signal is also the modulator's output signal. The modulator is a clocked system. It may use either analog or digital signal processing. To simplify the explanation below, only analog signal processing sigma delta modulators are discussed.

BRIEF SUMMARY OF THE INVENTION

The present invention provides a new sigma delta modulator which allows a number of clock cycles to operate in parallel. In a clocked system, the maximum clocking rate is determined by the time taken by the slowest component to complete its operations. In the sigma delta modulator, it is the settling of the integrator that takes the longest time. The other operations, such as signal addition or quantisation, may be made much faster than the integration. A key idea of the present invention is that signal addition operations are substituted for some of these rate-limiting integration operations, thus speeding up the overall modulator operation. Furthermore, these extra additions happen in parallel with additions that are required in any case.

According to the invention, there is provided a sigma delta converter comprising means for processing a succession of input signal samples in iterative manner to provide a succession of output signals and feedback signals matched to the input signal samples for at least one specified frequency range, characterised in that said processing means is arranged to carry out two or more successive iterations in parallel to provide a sequence of independent outputs available in parallel.

The converter according to the invention may comprise a plurality of feedback paths corresponding in number to the number of iteration-in-parallel operations, at least one of said feedback paths being associated with each of said iteration-in-parallel operations. In a particular arrangement, each of said feedback paths may be associated with each of two or more iteration-in-parallel operations.

Selected samples of said succession of input signal samples may be applied to at least one iteration-in-parallel operation. In a particular arrangement, selected samples of said succession of input signal samples may be applied to each of two or more iteration-in-parallel operations. In a favoured arrangement of the invention, different selected samples of said succession of input signal samples are suitably applied to at least two of two or more iteration-in-parallel operations.

In the converter according to the invention, each of said two or more operations in parallel may comprise a respective integrator stage. Independent outputs corresponding in number to the number of iteration-in-parallel operations may be established by a quantiser responsive at least to an output from each of said integrator stages. In a particular arrangement, said quantiser may also be responsive to selected samples of said succession of input signal samples.

The quantiser of the converter according to the invention may have two or more signal processing paths, each of said paths including summers and quantisers, one of the paths having a single quantisation output providing a final output of the quantiser, at least one other of the paths having two or more quantisation outputs, and selection of one of said two or more quantisation outputs of said at least one other of the paths to provide a further final output of the quantiser being determined by the single quantisation output of said one of the paths.

In a favoured embodiment, operation of a converter of the invention proceeds in accordance with the following equations:

$$I_1^{n+2} = I_1^n + V_{in}^n + V_{in}^{n+1} - DAC^n - DAC^{n+1} \quad (1)$$

$$I_2^{n+2} = I_2^n + 2*I_1^n + V_{in}^n - DAC^n \quad (2)$$

$$DAC^{n+1} = +1 \text{ if } 0.5*I_2^{n+1} + I_1^{n+1} > 0 \text{ else}$$

$$DAC^{n+1} = -1 \quad (3)$$

wherein $I_1^n$ is the output of a first integrator at time n, $I_2^n$ is the output of a second integrator at time n, $V_{in}^n$ is the input signal sampled at time n, $DAC^n$ is the feedback signal at time n, and n+1 and n+2 represent times subsequent to time n.

Times n, n+1 and n+2 are suitably defined in cyclic manner in a preferred embodiment of converter according to the invention.

In a further aspect, the invention also extends to a quantiser for use in data conversion having two or signal processing paths, each of which paths includes summers and quantisers, wherein each of said paths includes summers and quantisers, one of the paths has a single quantisation output providing a final output of the quantiser, at least one other of the paths has two or more quantisation outputs, and selection of one of said two or more quantisation outputs of said at least one other of the paths to provide a further final output of the quantiser is determined by the single quantisation output of said one of the paths.

In a quantiser according to the invention in this aspect or as embodied in the converter of the invention in its first aspect, selection of said one of said two or more quantisation outputs of said at least one other of the paths to provide a further final output of the quantiser may be determined by gate control of parallel outputs of said at least one other of the paths in dependence on said single quantisation output of said one of the paths.

BRIEF DESCRIPTION OF THE DRAWINGS

The invention will now be described in more detail having regard to the accompanying drawings, in which.

DETAILED DESCRIPTION OF THE DRAWINGS

Figure 1:
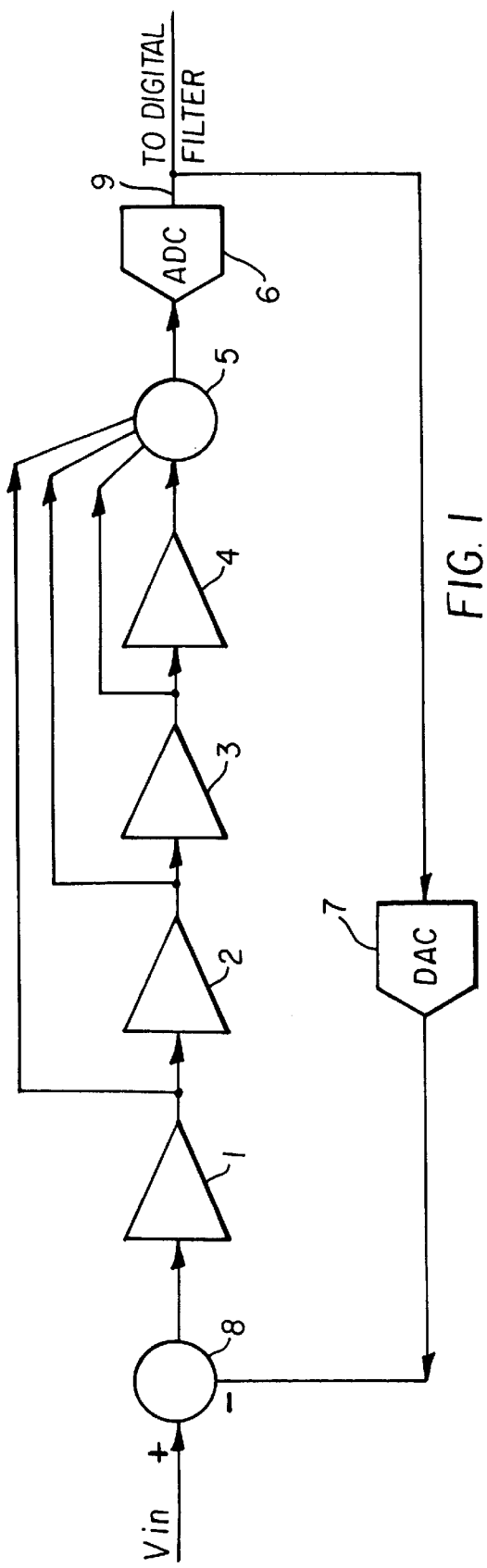
FIG. 1 shows a prior art sigma delta modulator.

FIG. 1 illustrates a sigma delta modulator from the prior art. An input signal $V_{in}$ is sampled at the modulator clock rate. The sampled signal is passed through a filter, consisting in this example of a cascade of four integrators 1, 2, 3, 4 and a summer 5 producing a weighted average of the integrator outputs, a quantiser (or analog to digital converter—ADC) 6, and a feedback path, DAC 7 and summer 8. Although this modulator uses analog signal processing, one of the signals, the quantiser output at 9, is digital. This signal is fed back to the digital to analog converter (DAC) 7. Often a single bit DAC is used at 7 and the quantiser 6 will consist of a single comparator. The feedback is negative in the sense that the DAC output is subtracted from the input signal at the filter input summer 8.

Figure 2:
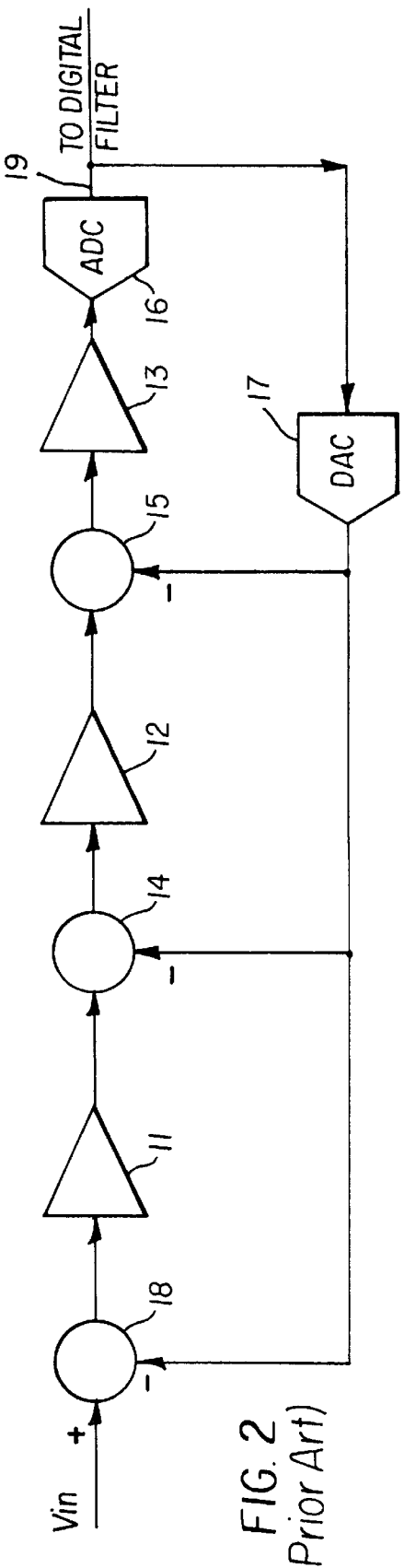
FIG. 2 shows another known sigma delta modulator.

A range of alternative prior art modulator configurations exist, a second one of which is shown in FIG. 2. The basic modulator structure is the same, but the filter configuration is changed. In this case there is a cascade of three integrators 11, 12, 13 and the DAC 17 output is fed back to each of the integrators, at summers 18, 14 and 15 respectively. The quantiser is designated by reference 16 and its output by reference 19.

The theory of operation of the sigma delta modulators is discussed elsewhere inter alia in J. C. Candy, "A use of double rate integration in sigma delta modulation", IEEE Trans. Commun., vol. COM-33, pp 249–258, March 1985.

However, a key aspect is that the modulator must be clocked at a frequency which is much higher than the input signal bandwidth. For instance, a 16 bit data converter requires a ratio of clocking frequency to input signal bandwidth (also called oversampling ratio) of between 50 to 1 and 200 to 1. Since any manufactured modulator has a limited clocking rate, the effect of the required oversampling ratio is to place a low upper limit on the allowed input signal bandwidth.

Difference Equations

Figure 4:
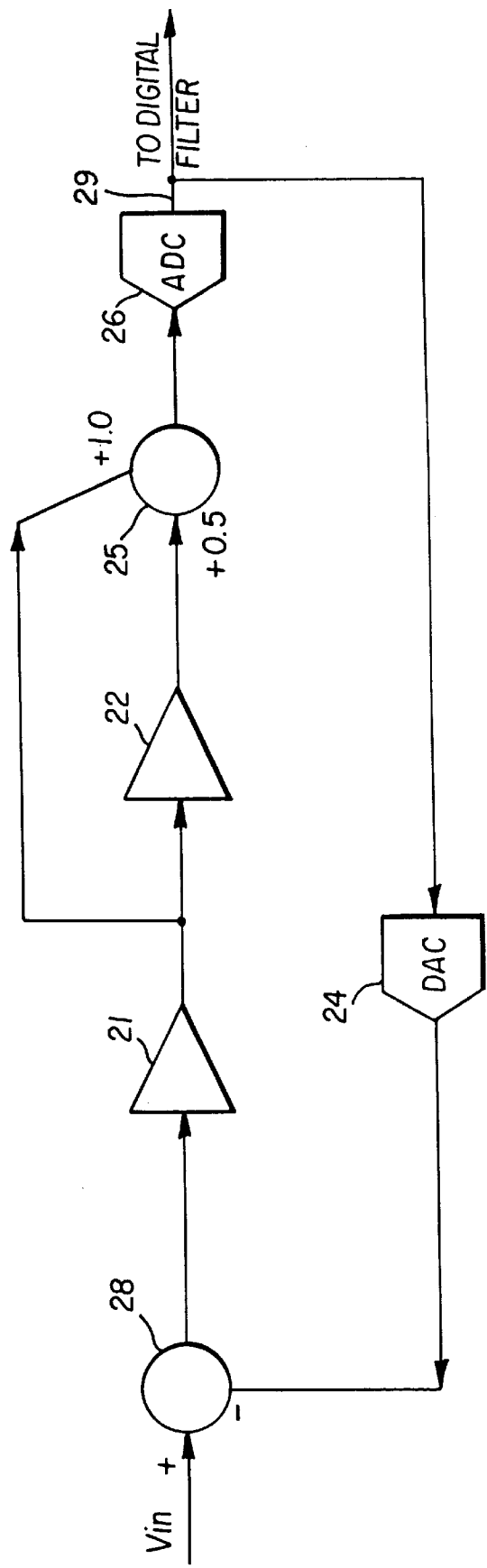
FIG. 4 shows a second order prior art sigma delta modulator.

To facilitate understanding of the modulator of the invention, the operation of an existing modulator may be considered in more detail. FIG. 4 shows a second order modulator from the prior art.

The summing node 25 at the input to the quantiser (ADC) 26 generates a weighted average of the two integrator outputs, i.e. that from integrator 21 and that from integrator 22. Suitable exemplary weightings may be 1.0 and 0.5 for integrators 21 and 21 respectively. The ideal operation of this modulator is described by the following difference equations which represent one clock cycle:

$$I_1^{n+1} = I_1^n + V_{in}^n - DAC^n \quad (1)$$

$$I_2^{n+1} = I_2^n + I_1^n \quad (2)$$

$$DAC^{n+1} = +1 \text{ if } 0.5*I_2^{n+1} + I_1^{n+1} > 0 \text{ else}$$

$$DAC^{n+1} = -1 \quad (3)$$

Here $I_1^n$ is the first (21) integrator output at time n, $V_{in}^n$ is the input signal sampled at time n, and $DAC^n$ is the feedback signal at time n. The combined operation of the quantiser and the DAC is represented by Equation (3). The updates to $DAC^{n+1}$, $I_2^{n+1}$ and $I_1^{n+1}$ all occur within the same clock cycle, i.e. the comparison represented by equation (3) occurs after but within the same clock cycle as the integrator updates on which it depends. The superscript n+1 refers to the subsequent clock period. The equations above, (1) to (3), provide a sufficiently complete description of the modulator operation for people skilled in the sigma delta field to be able to complete the modulator design.

Parallel Operation

Of these operations, the additions and comparisons are fast, while the integrations of equations (1) and (2) are very slow. The two integrations, for equations (1) and (2) respectively, occur in parallel. A particularly novel aspect of the present invention arises from the fact that the (slow) integration operations of equations (1) and (2) may be considered as additions, and a technique is presented which allows these integrations to be replaced by additions for a portion of clock cycles.

The difference equations for the subsequent clock cycle may now be considered:

$$I_1^{n+2} = I_1^{n+1} + V_{in}^{n+1} - DAC^{n+1} \quad (4)$$

$$I_2^{n+2} = I_2^{n+1} * I_1^{n+1} \quad (5)$$

$$DAC^{n+2} = +1 \text{ if } 0.5*I_2^{n+2} + I_1^{n+2} > 0 \text{ else}$$

$$DAC^{n+2} = -1 \quad (6)$$

Substituting for $I_1^{n+1}$ and $I_2^{n+1}$ from equations (1) and (2) respectively, gives:

$$I_1^{n+2} = I_1^n + V_{in}^n + V_{in}^{n+1} - DAC^n - DAC^{n+1} \quad (7)$$

$$I_2^{n+2} = I_2^n + 2*I_1^n + V_{in}^n - DAC^n \quad (8)$$

Figure 5:
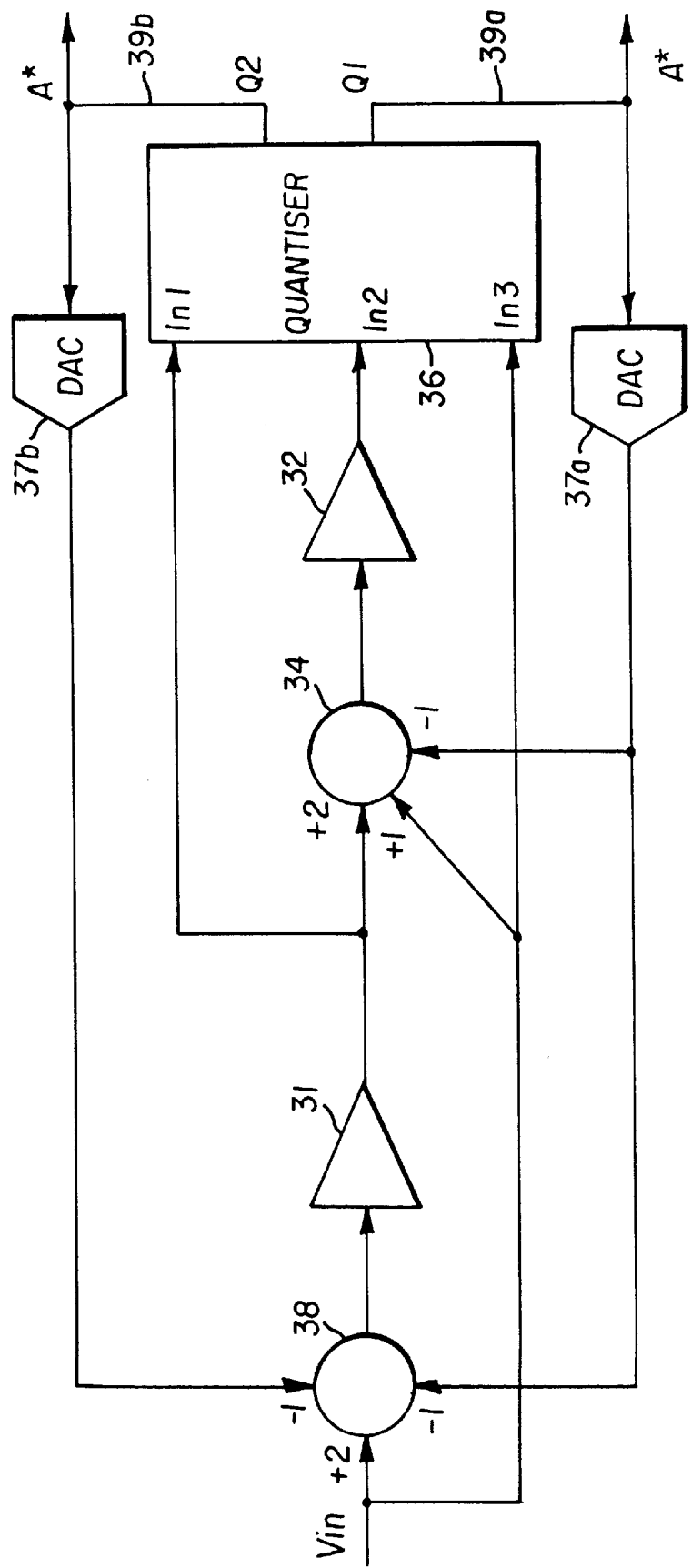
FIG. 5 shows a sigma delta modulator of order 2 in accordance with the present invention.

The set of equations (6), (7) and (8), describes a system which does the work of two consecutive clock cycles, but only requires two integrations (equations (7) and (8)), which occur in parallel. As additions are fast, the extra additions can be accommodated without creating delays. Thus, equations (7) and (8) describe a modulator where the odd-numbered clock cycles are performed in parallel with the even-numbered cycles, thereby allowing a factor of two increase in overall conversion speed. FIG. 5 illustrates a modulator incorporating this improvement in which the integrators are designated by references 31 and 32, summers by 34 and 38, the quantiser by 36, DACs by 37a and 37b, and quantiser outputs by 39a and 39b. Although the modulator outputs, $DAC^n$ and $DAC^{n+1}$, are produced in parallel, they may be treated by any subsequent signal processing as though they had been produced at consecutive clock cycles n and n+1, respectively.

The system described by equations (6), (7) and (8) is incomplete to the extent that the evaluation of $V_{in}$ and DAC at time n+1 is not specified. In practice these are not critical problems. $V_{in}$ has a relatively low bandwidth in most sigma delta modulators, so $V_{in}^{n+1}$ can be approximated as having the same value as $V_{in}^n$. Alternatively, since the sampling of $V_{in}$ is a relatively fast operation, the sampling of $V_{in}^n$ and $V_{in}^{n+1}$ can be interlaced at twice the modulator clock rate and added in parallel to the integrator inputs at the modulator clock rate.

$DAC^{n+1}$ can also be evaluated in a straightforward manner. The problem is to replace the quantiser represented by equation (3). The main accuracy requirement is that the replacement quantiser must produce outputs which help the overall loop stability. However, in order to maintain compatibility with existing sequential sigma delta modulators, it is preferable to use a quantiser which approximates the operation of known quantisers.

Figure 6:
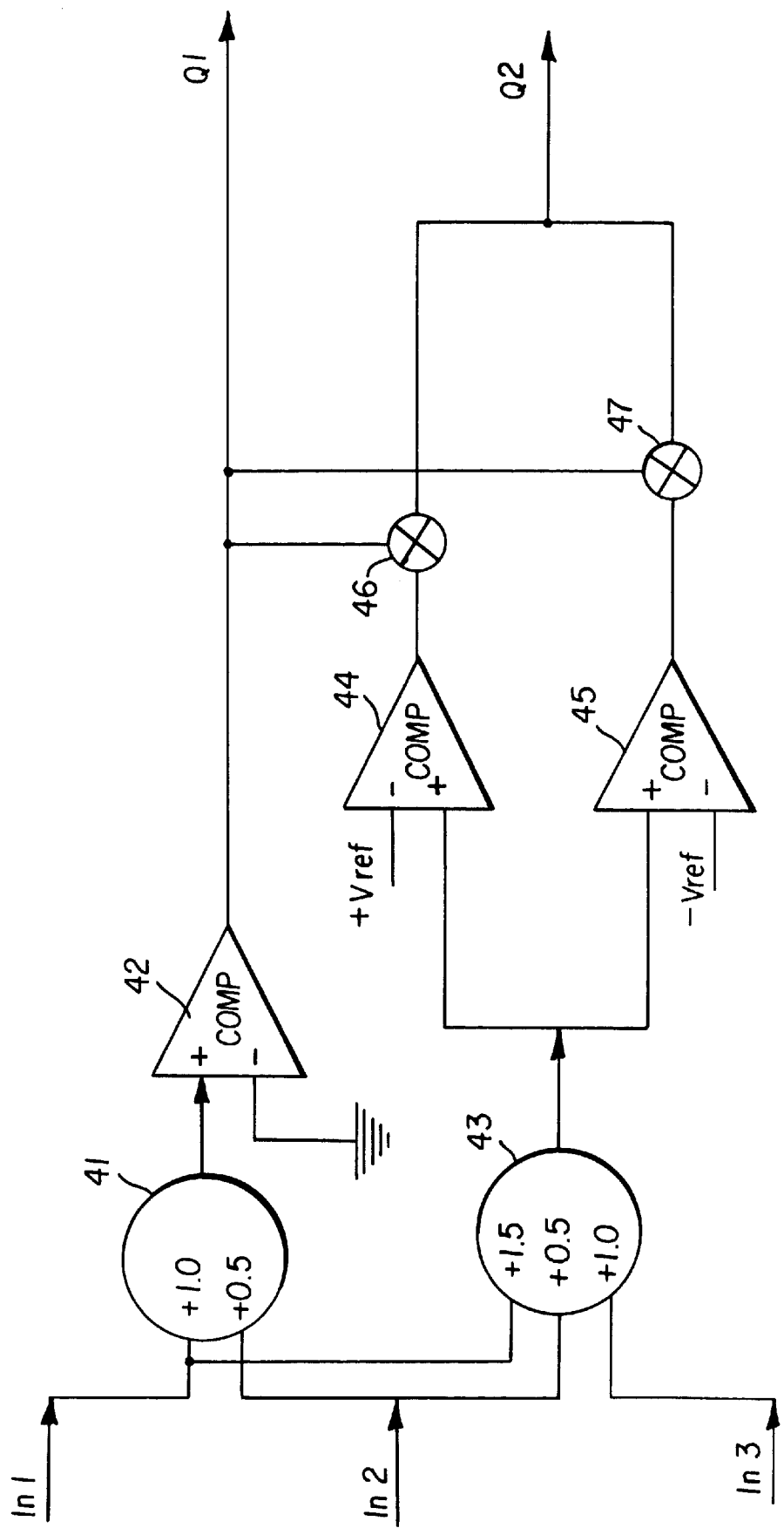
FIG. 6 is a preferred implementation of the quantiser of a modulator such as that of FIG. 5.

FIG. 6 illustrates one such quantiser and may be considered as an example of the quantiser used in FIG. 5. The quantiser of FIG. 6 has two outputs Q1 and Q2. Q1 operates exactly as the output of the quantiser of the original non-parallel modulator of prior art FIG. 4. Q1 is equivalent to $DAC^{n+2}$. The extra output Q2 approximates the values of DAC on odd clock cycles, or, to be more exact, the approximation lies in the way in which Q2 is calculated. Thus an approximate evaluation of $DAC^{n+3}$ is required. The equation for $DAC^{n+3}$ is:

$$DAC^{n+3}=+1 \text{ if } 0.5*I_2^{n+3}+I_2^{n+3}>0 \text{ else}$$
$$DAC^{n+3}=-1 \quad (9)$$

Thus in quantiser 36 of FIG. 5 as shown in detail in FIG. 6, inputs In1 and In2 (weighted) are summed, reference 41, and the summation applied to a comparator 42 to provide a quantised output Q1. Inputs In1 (weighted), In2 (weighted) and In3 are similarly summed, reference 43, and the summation is applied to a pair of comparators 44, 45 in parallel. At comparator 44, if the applied (summation) voltage is greater than the positive Vref, the output of the comparator is +1. At comparator 45, if the applied (summation) voltage is less than the negative Vref, the output of the comparator is −1. These comparator outputs proceed in parallel to respective gates 46, 47, one in each path. Gate 46 is operative to allow the signal from comparator 44 to pass, if the Q1 output is high, while gate 47 is effective if Q1 is low. Thus the quantised output of the summation stage 43 on the Q2 path is preselected or prelimited to its two possible values, and which of these two possibilities provides the final Q2 output is determined by the Q1 output. Since the possible options on the two Q2 paths controlled by the gates are plus and plus, minus and minus, or plus and minus (or minus and plus), it is only in the later case that there is an effective decision-making process resulting from the action of the Q1 signal.

An essential aspect of the invention is that the two clock cycles are merged to make the system work twice as fast. When the clock cycles are put in parallel, there is a distinction between even and odd cycles, but within the sequence of odd cycles, cycle N+3 may be the same as cycle N+1. Thus cycles 1, 3, 5 and 7 are all the same, as also are cycles 2, 4, 6 and 8, but cycle 1 is not the same as cycle 2. The relationship between cycle 1 and cycle 2 and between cycle 3 and cycle 4 is however the same as between each pair.

Thus N+3 is the same as N+1 and each N+3 may represent a new N+1. Thus N+3 denotes the odd umbered clock pulse following pulse N+2, but because of the cyclical nature of the system, it is also possible to use the notation N+1 to designate this cycle.

The approximation lies in evaluating $0.5 * I_2^{n+3}+I_1^{n+3}$ when only the previous clock cycle values, $I_2^{n+2}$ and $I_1^{n+2}$, are available. From the iteration defined by equations (1) and (2), it may be seen that:

$$0.5*I_2^{n+3}+I_1^{n+3}=0.5*I_2^{n+2}+1.5*I_1^{n+2}+V_{in}^{n+2}-DAC^{n+2}$$

and the comparison (9) may be replaced by:

$$DAC^{n+3}=+1 \text{ if } 0.5*I_2^{n+2}+1.5*I_1^{n+2}+V_{in}^{n+2}-DAC^{n+2}>0$$
$$\text{else } DAC^{n+3}=-1 \quad (10)$$

Since $DAC^{n+3}$ and $DAC^{n+2}$ are evaluated at the same time, $DAC^{n+2}$ is an unknown in equation (10). Moving the unknown to the right hand side gives:

$$DAC^{n+3}=+1 \text{ if } 0.5*I_2^{n+2}+1.5*I_1^{n+2}+V_{in}^{n+2}>DAC^{n+2}$$
$$\text{else } DAC^{n+3}=-1 \quad (11)$$

In the present example, $DAC^{n+2}$ has two allowed values. Two comparisons may be used in place of equation (11), one assuming that $DAC^{n+2}$ is positive and the other assuming that it is negative. Then, when $DAC^{n+2}$ becomes available, a choice may be made as to which comparison result leads to the correct value of $DAC^{n+3}$. Since the selection circuit may comprise a small amount of simple digital logic, as shown in FIG. 6, the selection will have an insignificant impact on the overall time required per clock cycle.

More Parallelism

The invention is not restricted to the particular implementation described above. Any number of clock cycles may be put in parallel. A separate quantiser output for each clock cycle to be performed in parallel is required, with a separate feedback path from each of those quantiser outputs to the filter. The separate feedback signals are added, in the digital or analog domains, before being subtracted at the relevant filter integrator inputs. The separate feedback signals are subtracted with different or zero weightings at each integrator input. For instance in the example above, the feedback weights are (1,1) at the first integrator and (1,0) at the second integrator, for the Q1 and Q2 quantiser outputs. If this is extended to three cycles in parallel, the respective weights for the three quantiser outputs, (Q1, Q2, Q3), would be (1,1,1) at the first integrator and (2,1,0) at the second integrator.

Higher Order Modulators

Figure 3:
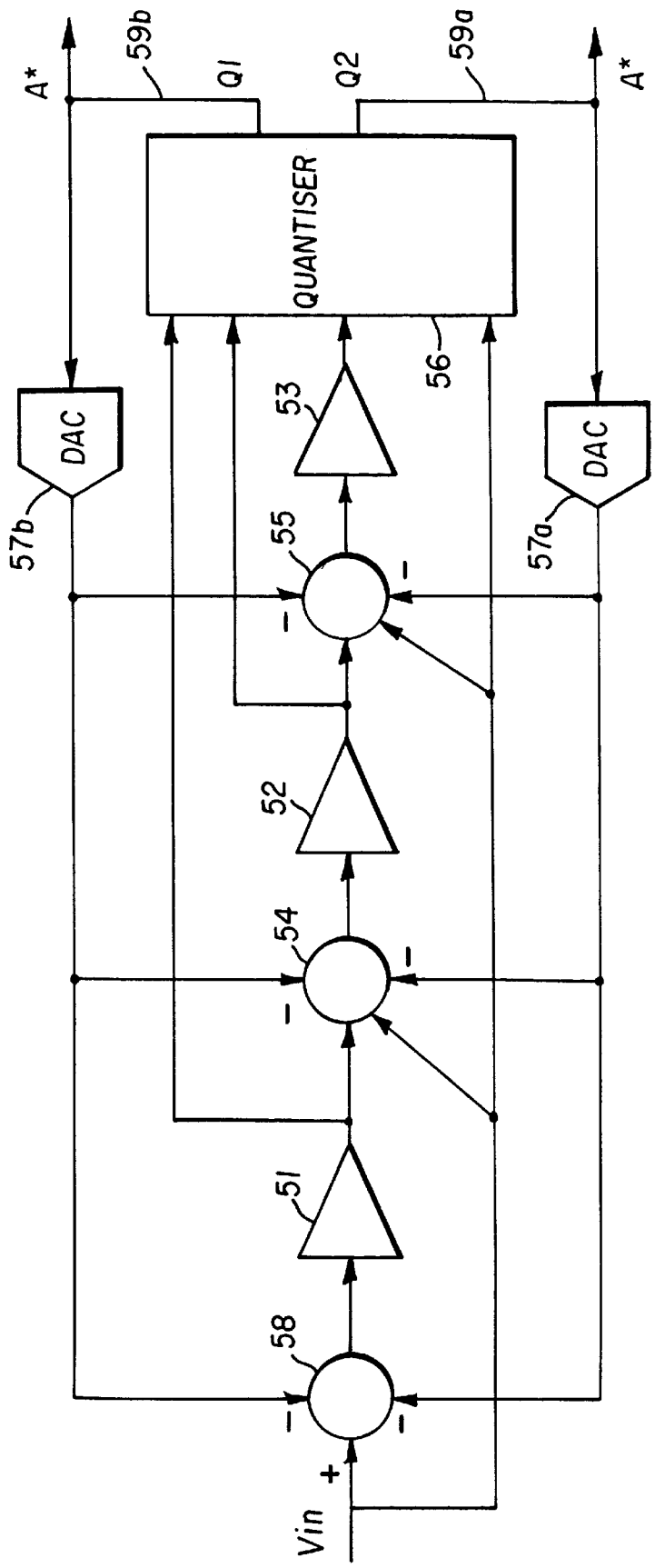
FIG. 3 shows a parallel sigma delta modulator according to the present invention.

The invention may be applied to higher order modulators of the kind shown in FIGS. 1 and 2. An example of such an implementation is shown in FIG. 3. It has a separate quantiser output 59a, 59b for both clock cycles to be performed in parallel, and separate feedback paths with DACs 57a, 57b respectively from each of those quantiser outputs 59a, 59b to the inputs of the filter's integrators 51, 52, 53 inputs.

Simplified Input Sampling

Figure 9:
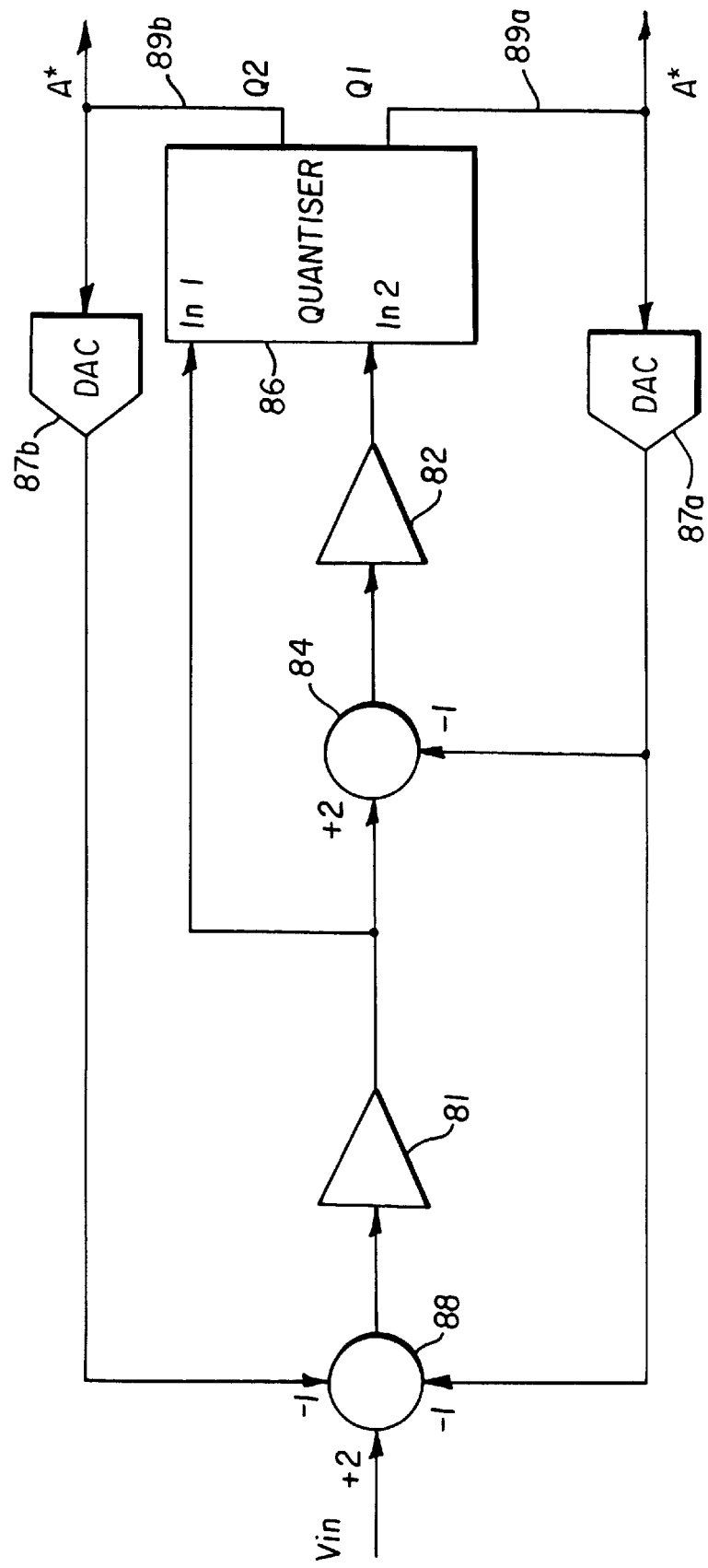
FIG. 9 shows a sigma delta modulator according to the invention with simplified input sampling.

In many applications of sigma delta converters, the input signal is limited to a low frequency range. In such cases, the input sampling for the parallel modulator may be simplified. An example of such an arrangement is shown in FIG. 9, which presents a simplified version of the circuit of FIG. 2, using reference numerals corresponding in the second digit in each case to those of FIG. 5, but in the range 81 to 89 (31 to 39 for FIG. 5). As shown in FIG. 9, samples of the input are fed to the first integrator 81 only, but are not fed either to the second integrator 82 or to the quantiser 86. While this simplification causes some imaging of the low frequency input signal to appear in the modulator output stream at higher frequencies, close to the sampling clock rate, the overall effect of such imaging is however substantially negligible, since such modulators are normally used with low pass digital filters.

Multibit Feedback

The invention described here may also be combined with multibit feedback modulators. Multibit feedback modulators such as described in F. Chen and B. H. Leung "A high resolution multibit sigma delta modulator with individual level averaging" IEEE JSSC, vol. 30, 1995, pp 453–460, improve converter signal to noise ratio by reducing quantisation noise at the quantiser. In the present invention each quantiser output and corresponding feedback signal may be multibit rather than single bit as in the examples above. In such cases the corresponding DACs are also multibit.

The present invention differs from multibit feedback in two ways. Firstly, the relative weights of the separate feedback signals are different at each integrator in the present invention, but in the multibit feedback case the relative weights are identical at all integrators. Secondly, in the present invention, the separate feedback signals represent consecutive samples of the same signal, while in the multibit feedback case, the separate bits are all part of the same sample.

Digital Addition of Feedback Signals

Figure 7:
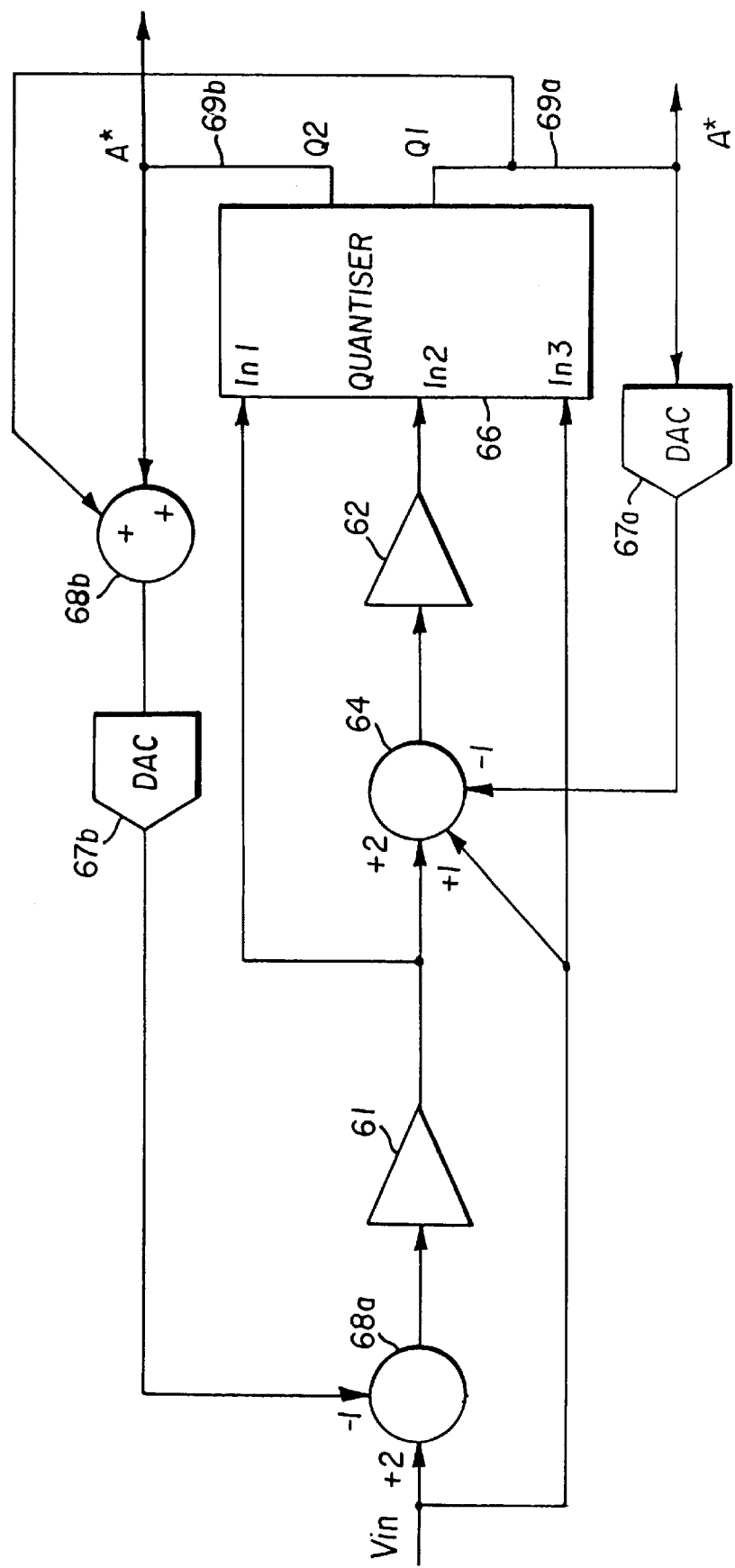
FIG. 7 shows a parallel sigma delta modulator according to the invention with digital addition of feedback.

Since the feedback signals are quantised, they may be added in either the digital or analog domains. FIG. 7 shows a parallel sigma delta modulator similar to that of FIG. 5, where the feedback signals are added in the digital domain. In such cases a separate addition circuit is required for each integrator, since the feedback signals have different relative weights at each integrator.

Bit Shuffling

The multi-signal feedback nature of the present invention may however leave it susceptible to errors due to the normal manufacturing variation of the circuit components. Consider the example of FIG. 7. Two signals, $DAC^n$ and $DAC^{n+1}$, are fed back to the first integrator 61 via a DAC 67b. Because of manufacturing variation, the DAC cannot give identical weighting to its two input signals. Compared to the prior art modulator that it replaces, it feeds back differently sized signals on odd and even clock cycles. This leads to signal distortion and to aliasing of quantisation noise into the signal band.

Figure 8:
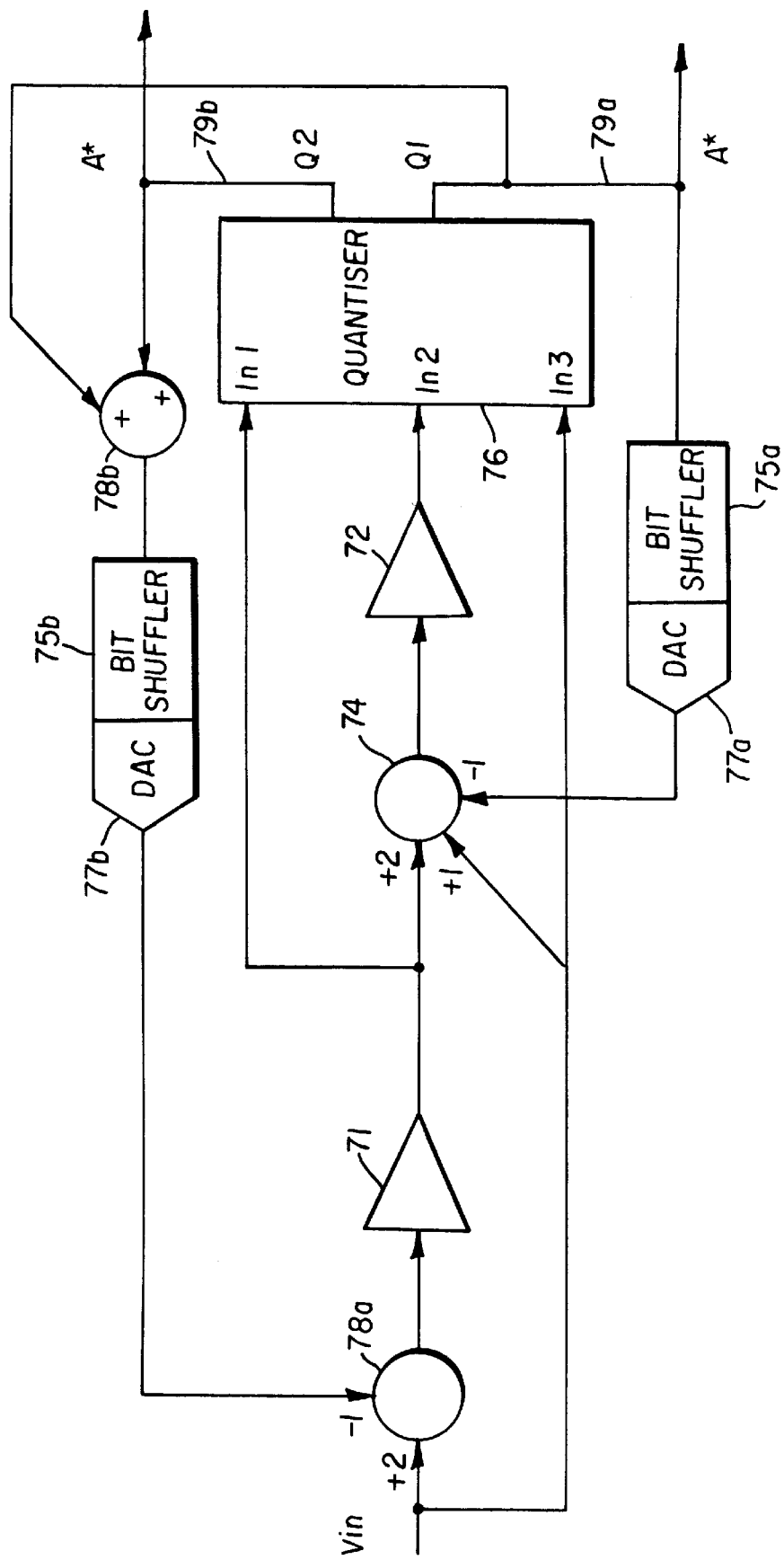
FIG. 8 shows a sigma delta modulator according to the invention with bit shuffler DACS.

Much recent work is included in Chen and Leung, referred to above, on techniques to reduce in-band signal distortion arising through the use of multibit DACs, so improving overall converter total harmonic distortion. These use so-called "bit-shufflers" within the DACs to dynamically change the subset of DAC elements used to generate any particular DAC code. Such bit-shuffler DACs may be used in the present invention and result in improved total harmonic distortion, particularly if the feedback signals are added in the digital domain. FIG. 8 illustrates the present invention with bit shufflers 75a, 75b in the DACs 77a, 77b. The system of FIG. 8 is otherwise similar to that of FIG. 7, the reference numerals corresponding to those of FIG. 7, but in the range 71–79 as compared with 61–69 for FIG. 7.

Double Rate Modulators

The present invention is to be distinguished from the double rate sigma delta modulator described in U.S. Pat. No. 5,030,954 to D. B. Ribner for "Double Rate Oversampled Interpolative Modulators for analog to Digital Conversion", which is very different from the present invention. The double rate scheme relies on the fact that prior modulators had used a two phase clock for integration: one phase for signal sampling and one for integration. The overall conversion rate is doubled by using a single phase, with both sampling and integration occurring during that time. In contrast, the movement of the present invention does not reside on its clocking scheme. The present invention requires a quantiser with more than one output signal and more than one feedback path to the integrators. A clock rate improvement similar to that achieved by Ribner could however be used with the present invention to achieve a further speed-up.

We claim:

1. A sigma delta converter comprising means for processing a succession of input signal samples in iterative manner to provide a succession of output signals and feedback signals matched to the input signal samples for at least one specified frequency range, said processing means being arranged to carry out two or more successive iterations in parallel to provide a sequence of independent outputs available in parallel.

2. A converter according to claim 1, comprising a plurality of feedback paths corresponding in number to the number of iteration-in-parallel operations, at least one of said feedback paths being associated with each of said iteration-in-parallel operations.

3. A converter according to claim 2, wherein each of said feedback paths is associated with each of two or more iteration-in-parallel operations.

4. A converter according to claim 1, wherein selected samples of said succession of input signal samples are applied to at least one iteration-in-parallel operation.

5. A converter according to claim 4, wherein selected samples of said succession of input signal samples are applied to each of two or more iteration-in-parallel operations.

6. A converter according to claim 4, wherein different selected samples of said succession of input signal samples are applied to at least two of two or more iteration-in-parallel operations.

7. A converter according to claim 1, wherein each of said two or more iterations in parallel comprises a respective integrator stage.

8. A converter according to claim 7, wherein independent outputs corresponding in number to the number of iteration-in-parallel operations are established by a quantiser responsive at least to an output from each of said integrator stages.

9. A converter according to claim 8, wherein said quantiser is also responsive to selected samples of said succession of input signal samples.

10. A converter according to claim 8, comprising a quantiser having two or more signal processing paths, each of said paths including summers and quantisers, wherein one of the paths has a single quantisation output providing a final output of the quantiser, at least one other of the paths has two or more quantisation outputs, and selection of one of said two or more quantisation outputs of said at least one other of the paths to provide a further final output of the quantiser is determined by the single quantisation output of said one of the paths.

11. A converter according to claim 10, wherein selection of said one of said two or more quantisation outputs of said at least one other of the paths to provide a further final output of the quantiser is determined by gate control of parallel outputs of said at least one other of the paths in dependence on said single quantisation output of said one of the paths.

12. A converter according to claim 11, wherein times n, n+1 and n+2 are defined in cyclic manner.

13. A converter according to claim 1, the operation of which is in accordance with the following equations:

$$I_1^{n+2} = I_1^n + V_{in}^n + V_{in}^{n+1} - DAC^n - DAC^{n+1} \quad (1)$$

$$I_2^{n+2} = I_2^n + 2*I_1^n + V_{in}^n - DAC^n \quad (2)$$

$$DAC^{n+1} = +1 \text{ if } 0.5*I_2^{n+1} + I_1^{n+} > 0 \text{ else}$$

$$DAC^{n+1} = -1 \quad (3)$$

wherein $I_1^n$ is the output of a first integrator at time n, $I_2^n$ is the output of a second integrator at time n, $V_{in}^n$ is the input signal sampled at time n, $DAC^n$ is the feedback signal at time n, and n+1 and n+2 represent times subsequent to time n.

14. A quantiser for use in data conversion having two or more signal processing paths, each of which paths includes summers and quantisers, wherein one of the paths has a single quantisation output providing a final output of the quantiser, at least one other of the paths has two or more quantisation outputs, and selection of one of said two or more quantisation outputs of said at least one other of the paths to provide a further final output of the quantiser is determined by the single quantisation output of said one of the paths.

15. A quantiser according to claim 14, wherein selection of said one of said two or more quantisation outputs of said at least one other of the paths to provide a further final output of the quantiser is determined by gate control of parallel outputs of said at least one other of the paths in dependence on said single quantisation output of said one of the paths.

16. A sigma delta converter comprising means for processing a succession of input signal samples in iterative manner to provide a succession of output signals and feedback signals matched to the input signal samples for at least one specified frequency range, said processing means being arranged to carry out two or more successive iterations in parallel to provide a sequence of independent outputs available in parallel, a plurality of feedback paths being provided, said plurality of feedback paths corresponding in number to the number of iteration-in-parallel operations, at least one of said feedback paths being associated with each of said iteration-in-parallel operations, selected samples of said succession of input signals being applied to at least one iteration-in-parallel operation, each of said two or more iterations in parallel comprising a respective integrator stage, and independent outputs corresponding in number to the number of iteration-in-parallel operations being established by a quantiser responsive at least to an output from each of said integrator stages.

17. A converter according to claim 16, wherein selected samples of said succession of input signal samples are applied to each of two or more iteration-in-parallel operations, different selected samples of said succession of input signal samples being applied to at least two or more iteration-in-parallel operations, and said quantiser is also responsive to selected samples of said succession of input signal samples.

18. A converter according to claim 16, wherein each of said feedback paths is associated with each of two or more iteration-in-parallel operations, selected samples of said succession of input signal samples being applied to each of two or more iteration-in-parallel operations, and said quantiser is also responsive to selected samples of said succession of input signal samples.

19. A converter according to claim 16, comprising a quantiser having two or more signal processing paths, each of said paths including summers and quantisers, wherein one of the paths has a single quantisation output providing a final output of the quantiser, at least one other of the paths has two or more quantisation outputs, and selection of one of said two or more quantisation outputs of said at least one other of the paths to provide a further final output of the quantiser is determined by gate control of parallel outputs of said at least one other of the paths in dependence on said single quantisation output of said one of the paths.

20. A converter according to claim 16, the operation of which is in accordance with the following equations:

$$I_1^{n+2} = I_1^n + V_{in}^n + V_{in}^{n+1} - DAC^n - DAC^{n+1} \quad (1)$$

$$I_2^{n+2} = I_2^n + 2*I_1^n + V_{in}^n - DAC^n \quad (2)$$

$$DAC^{n+1} = +1 \text{ if } 0.5*I_2^{n+1} + I_1^{n+1} > 0 \text{ else}$$

$$DAC^{n+1} = -1 \quad (3)$$

wherein $I_1^n$ is the output of a first integrator at time n, $I_2^n$ is the output of a second integrator at time n, $V_{in}^n$ is the input signal sampled at time n, $DAC^n$ is the feedback signal at time n, n+1 and n+2 represent times subsequent to time n, and times n, n+1 and n+2 are defined in cyclic manner.

* * * * *